US012034452B2

(12) United States Patent
Gruber et al.

(10) Patent No.: US 12,034,452 B2
(45) Date of Patent: Jul. 9, 2024

(54) DIGITAL-TO-ANALOG CONVERTER, TRANSMITTER, BASE STATION, MOBILE DEVICE AND METHOD FOR A DIGITAL-TO-ANALOG CONVERTER

(71) Applicant: Intel Corporation, Santa Clara, CA (US)

(72) Inventors: Daniel Gruber, St. Andrae (AT); Michael Kalcher, Villach (AT); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 17/132,000

(22) Filed: Dec. 23, 2020

(65) Prior Publication Data

US 2022/0209786 A1    Jun. 30, 2022

(51) Int. Cl.
*H03M 1/72* (2006.01)
*H04B 1/04* (2006.01)
*H04W 88/08* (2009.01)

(52) U.S. Cl.
CPC ............... *H03M 1/72* (2013.01); *H04B 1/04* (2013.01); *H04W 88/08* (2013.01)

(58) Field of Classification Search
CPC ........ H03M 1/72; H03M 1/0665; H03M 1/66; H04B 1/04; H04B 1/0007; H04W 88/08
See application file for complete search history.

(56) References Cited

U.S. PATENT DOCUMENTS 9,379,883 B1 * 6/2016 Kuttner ............... H04L 1/22
2009/0009641 A1 * 1/2009 Asayama ............. H04N 25/75
348/294

* cited by examiner

*Primary Examiner* — Vineeta S Panwalkar
(74) *Attorney, Agent, or Firm* — 2SPL Patent Attorneys PartG mbB; Yong Beom Hwang

(57) ABSTRACT

A Digital-to-Analog Converter (DAC) is provided. The DAC includes a code converter circuit configured to sequentially receive first digital control codes for controlling N digital-to-analog converter cells. N is an integer greater than one. The code converter circuit is further configured to convert the first digital control codes to second digital control codes. Additionally, the DAC includes a bit-shifter circuit configured to receive shift codes for the second digital control codes. The shift codes are obtained using dynamic element matching and indicate a respective circular shift by $r_i$ bit positions for the i-th second digital control code, wherein $r_i$ is an integer smaller than N−1. The bit-shifter circuit is further configured to generate third digital control codes by circularly shifting the second digital codes based on the shift codes. In addition, the DAC includes a cell activation circuit configured to selectively activate one or more of the N digital-to-analog converter cells based on the third digital control codes.

25 Claims, 14 Drawing Sheets

(a)
(b)
(c)

DIGITAL-TO-ANALOG CONVERTER, TRANSMITTER, BASE STATION, MOBILE DEVICE AND METHOD FOR A DIGITAL-TO-ANALOG CONVERTER

FIELD

The present disclosure relates to digital-to-analog conversion. In particular, examples relate to a Digital-to-Analog Converter (DAC), a transmitter comprising the DAC, a base station comprising the transmitter, a mobile device comprising the transmitter and a method for a DAC.

BACKGROUND

Dynamic Element Matching (DEM) is an effective mechanism to compensate for random imperfections in DACs. For example, in unitary weighted DACs, a number n of converter cells are activated when a number n is requested by the digital input. As the individual cells of a practical DAC are not perfectly identical, the analog output signal includes an error. If the selection of n cells for each possible output code is fixed, this error is systematic and will translate into harmonic distortion.

DEM should allow to select a different set of cells each time a code is requested in order to reduce systematic errors, attenuating harmonic distortion. Further, DEM should allow to minimize the switching activity of the converter cells (e.g. switch as little cells as possible) in order to reduce switching noise and associated power consumption. In addition, DEM should only require low implementation complexity to enable circuit implementation and low power consumption. This may be of particular importance since the selection algorithm needs to run at the DAC's (e.g. very high) sampling rate.

Conventional DEM approaches can either optimize only the switching noise or only the harmonic distortion. Conventional DEM approaches that can optimize both simultaneously suffer from extensive circuit complexity and other unwanted spurious tones or undesired noise shaping.

Hence, there may be a desire for improved DEM based digital-to-analog conversion.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
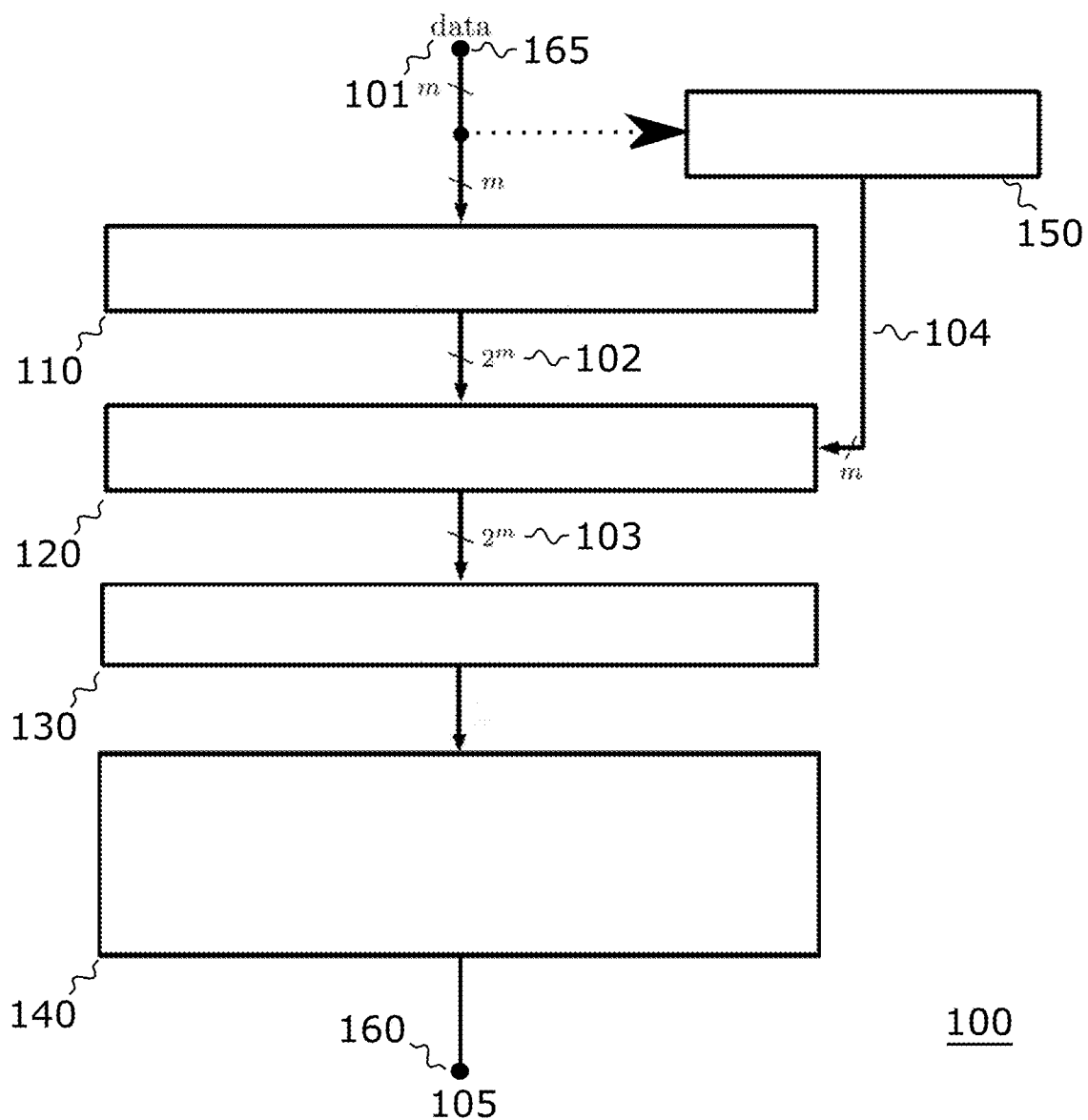
FIG. 1 illustrates a first example of a DAC.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates a first example of a DAC 100. The DAC 100 comprises an input node 165 configured to receive first digital control codes 101 for controlling N DAC cells 140 of the DAC 100. N is an integer greater than one, i.e. N≥2. For example, for a bit length m of the first digital control codes 101, the number of DAC cells 140 may be $N \leq 2^m$.

The DAC 100 comprises a code converter circuit 110 configured to receive the first digital control codes 101. The code converter circuit 100 is further configured to convert the first digital control codes 101 to second digital control codes 102. For example, the first digital control codes 101 may be binary codes, and the second digital control codes 102 may be unitary (unary) codes. Accordingly, the N DAC cells 140 may be unitary weighted.

A bit-shifter circuit 120 (e.g. a barrel shifter circuit or a barrel rotator circuit) of the DAC 100 is configured to receive shift codes 104 for the second digital control codes 102. The shift codes 104 are obtained using DEM and indicate a respective circular shift by $r_i$ bit positions for the i-th second digital control code among (of) the second digital control codes 102. The bit-shifter circuit 120 is further configured to generate third digital control codes 103 by circularly shifting the second digital codes 102 based on the shift codes 104. In other words, the bit-shifter circuit 120 circularly shifts the second digital codes 102 by the respective number of bit positions $r_i$ in order to obtain the third digital control codes 103.

The DAC 100 further comprises a cell activation circuit 130 configured to selectively activate one or more of the N DAC cells 140 based on the third digital control codes 103. Each activated DAC cell is configured to output a respective cell output signal. For example, based on the third digital control codes 103, the cell activation circuit 130 may be configured to generate and supply one or more respective activation/drive signals to the N DAC cells 140 for activating and/or driving one or more of the N DAC cells 140. An output node 160 of the DAC 100 is configured to output an analog output signal 105 based on the cell output signals of the activated DAC cells. For example, the output node 160 of the DAC 100 may be coupled to the N DAC cells 140 and be configured to combine (sum) the cell output signals of the activated DAC cells in order to generate the analog output signal 105 of the DAC 100.

In the example of FIG. 1, the DAC 100 comprises processing circuitry 150 configured to generate the shift codes 104 by DEM. In particular, the processing circuitry 150 generates the shift codes 104 such that $r_i$ is an integer smaller than N−1. As a consequence, the second digital codes 102 are bit-shifted by less than N−1 bit positions. For example, the processing circuitry 150 may be configured to run (execute) a DEM algorithm for generating the shift codes 104 by DEM.

The DAC 100 may, therefore, enable a DEM based activation of the N DAC cells 140 with reduced switching activity and, hence, enable a trade-off between caused harmonic distortions and DAC cell switching activity. In particular, the rotations $r_i$ indicated by the shift codes 104 may allow to decorrelate the input first digital control codes 101 from the activated DAC cells. The activated (selected) DAC cells are shifted only by a reduced number of cells, which may result in increased correlation of the analog output signal 105 and the DAC cells' errors but at the same time may reduce the switching activity, the noise floor of the analog output signal 105, and the power consumption of the DAC 100. The DAC 100 may allow to optimize both the harmonic distortion and noise simultaneously in a simple and hardware friendly way. The DAC 100 may be used as a high speed DAC (e.g. for sampling frequencies of 10 GHz and higher) due to its simplicity.

Figure 2:
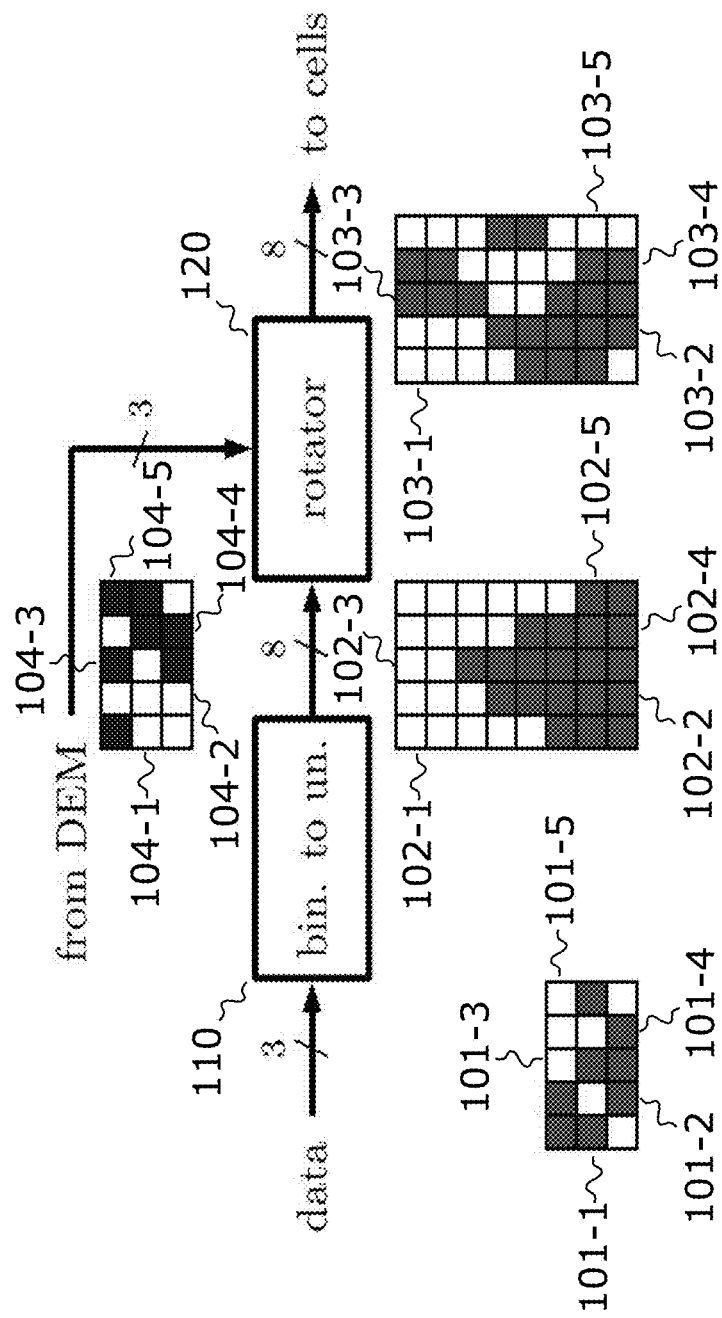
FIG. 2 illustrates a first example of digital control code conversion.

An exemplary code rotation according to the present disclosure is illustrated in FIG. 2. A sequence of five first digital control codes 101-1, . . . 101-5 is received by the code converter circuit 110. The first digital control codes 101-1, . . . 101-5 are binary codes with a bit-length of m=3 for controlling $N=2^m=8$ DAC cells. The hatched (colored) blocks in each column indicate the "1's" of the respective first digital control code, and the white blocks in each column indicate the "0's" of the respective first digital control code.

The code converter circuit 110 converts the five first digital control codes 101-1, . . . 101-5 by binary-to-unitary conversion such that five second digital control codes 102-1, . . . 102-5 are obtained. The second digital control codes 102-1, . . . 102-5 are unitary codes. Similarly to what is described above for the first digital control codes, the hatched (colored) blocks in each column indicate the "1's" of the respective second digital control code, and the white blocks in each column indicate the "0's" of the respective second digital control code.

The bit-shifter circuit 120 receives the five second digital control codes 102-1, . . . 102-5 and receives five shift codes 104-1, . . . 104-5 for the second digital control codes 102-1, . . . 102-5. Each of the shift codes 104-1, . . . 104-5 indicates a respective circular shift by $r_i$ bit positions for the i-th second digital control code among second digital control codes 102-1, . . . 102-5. For example, the shift code 104-2 indicates a circular shift by $r_2$ bit positions for the second digital control code 102-2. The number $r_i$ of bit positions indicated by each of the shift codes 104-1, . . . 104-5 is smaller than N−1=7. In other words, $r_i \in [0; 6]$ in the example of FIG. 2.

The bit-shifter circuit 120 circularly shifts each of the second digital control codes 102-1, . . . 102-5 by the number $r_i$ of bit positions indicated by the corresponding one of the shift codes 104-1, . . . 104-5. For example, the bit-shifter circuit 120 circularly shifts the second digital control code 102-2 by the number $r_2$ of bit positions indicated by the shift code 104-2. The bit-shifter circuit 120 outputs the generated third digital control codes 103-1, . . . 103-5. Similarly to what is described above for the first and second digital control codes, the hatched (colored) blocks in each column indicate the "1's" of the respective third digital control code, and the white blocks in each column indicate the "0's" of the respective third digital control code.

As can be seen from FIG. 2, the shift codes 104-1, . . . 104-5 allow to scramble the second digital control codes 102-1, . . . 102-5 and, hence, the activated DAC cells. As the value range for the circular shifts of the second digital control codes 102-1, . . . 102-5 is limited, the switching activity may be reduced and, hence, a trade-off between harmonic distortions in the analog output signal of the DAC and the DAC cell switching activity may be achieved.

Returning back to FIG. 1, the generation of the shift codes 104 by the processing circuitry 150 may be independent of the first digital control codes 101. For example, the processing circuitry 150 may be configured to generate the shift codes based on a random or pseudorandom binary sequence. In other examples, the processing circuitry 150 may be configured to generate the shift codes 104 based on the first digital control codes 101 by DEM.

The proposed technique may allow reduce the DAC's switching noise by reducing the effective range of rotations to $0 \le r_i < D \le N-1$ with D being an integer. Choosing the maximum rotation $r_i < D < N$ may allow to effectively decrease harmonic distortions in the analog output signal 105 of the DAC 100. Further, it may allow a trade-off between the reduction of harmonic distortion and the increase of switching activity (which increases noise floor and power consumption). By reducing the effective range of rotations by lowering D<N, the distortion specification of the DAC may be met by a minimum increase in power consumption and noise floor.

Further, the restricted range of rotations may allow to reduce the implementation complexity of the bit-shifter circuit 120. In some example, a bit-shifter circuit 120 may be used that is capable of circularly shifting the second digital codes 102 at maximum by D−1 bit positions. For example, if the bit-shifter circuit 120 is an N-barrel rotator, the N-barrel rotator may be reduced to an N-barrel rotator with a maximum rotation of D−1.

In some example, the processing circuitry 150 may be configured to adjust the value of D based on control data. In other words, D may be programmable such that the effective range of rotations may be programmable. Accordingly, the control data may be used to select D in order achieve a desired (target) trade-off between harmonic distortion, noise floor and power consumption. In some examples, the control data indicate the value of D. In other examples, the value of D may be chosen based on external factors. For example, the control data may indicate a signal property of a digital signal from which the first digital control codes 101 is derived. The signal property may, e.g., be a maximum amplitude, a Root-Mean-Square (RMS) power or any other signal property. Similarly, the control data may indicate a target property of analog signal which is based on the analog output signal 105 of the DAC. For example, the control data may indicate a target property of a Radio Frequency (RF) transmit signal which is based on the analog output signal 105 of the DAC. Accordingly, the processing circuitry 150 may be configured to adjust the value of D based on the signal property of the digital signal or the target property of the analog signal.

In some examples, the number $r_i$ of bit positions indicated by each of the shift codes 104 may be smaller than N−1. In other examples, an offset may be used in order to statically shift the bit rotations and, hence, the effectively used DAC cells of the N DAC cells 140. For example, the processing circuitry 150 may be configured to generate the shift codes 104 such that $0 \leq r_i \leq D < N-1$ during a first time interval and that $b \leq \tilde{r}_i D+b \leq N+b-1$ with $r_i = \tilde{r}_i$ mod N during a second time interval. b is an integer like D and b<N. mod denotes the modulo operation. In other words, the value range for $r_i$ is offset by the value b during the second time interval with respect the value range used during the first time interval. For example, if $0 \leq r_i < D \leq N-1$ is the default setting (b=0 here), a region of cells selected with this setting may degrade performance (e.g. due to gradient effects at the border of an array of the N DAC cells 140). Using the offset b may allow to shift the selected cells such that the degraded DAC cells are not used. Hence, the DAC performance may be further increased.

Figure 3:
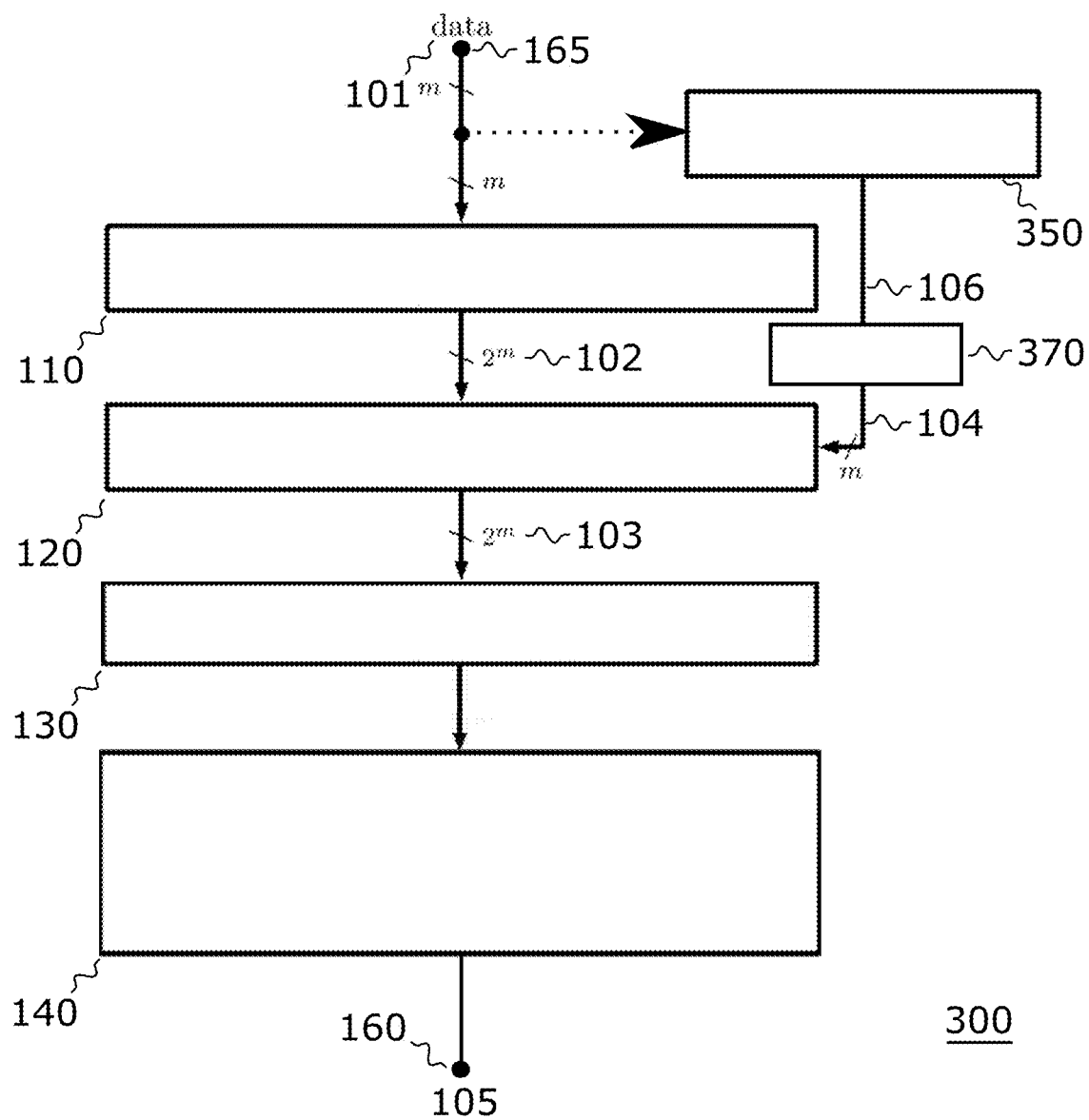
FIG. 3 illustrates a second example of a DAC.

The reduction of D may be considered in the DEM algorithm itself as described above for the DAC 100. In other examples, D may be effectively reduced between the DEM algorithm and the bit-shifter circuit (e.g. a barrel rotator). An example of a corresponding DAC 300 is illustrated in FIG. 3.

In contrast to the DAC 100, the DAC 300 comprises processing circuitry 350 configured to generate raw shift codes 106 by DEM. The generation of the raw shift codes 106 by the processing circuitry 350 may be independent of the first digital control codes 101. For example, the processing circuitry 350 may be configured to generate the raw shift codes 106 based on a random or pseudorandom binary sequence. In other examples, the processing circuitry 350 may be configured to generate the raw shift codes 106 based on the first digital control codes 101 by DEM. For example, the processing circuitry 350 may be configured to run (execute) a DEM algorithm for generating the raw shift codes 106 by DEM.

The raw shift codes 106 indicate a respective circular shift by $k_i$ bit positions for the i-th second digital control code 102. The value range for $k_i$ is not restricted like the value range for $r_i$. In particular, $k_i$ may take values greater than N−2.

In order to compensate for this, the DAC 300 additionally comprises a range restriction circuit 370 configured to receive the raw shift codes 106. The range restriction circuit 370 is further configured to at least modify all of the raw shift codes 106 indicating $k_i \geq N-1$ in order to obtain the shift codes 104.

Similar to what is described above, the bit-shifter circuit 120 receives the shift codes 104 from the range restriction circuit 370 and circularly shifts the second digital codes 102 based on the shift codes 104 in order to generate the third digital control codes 103.

By reducing the effective range of rotation for the second digital codes 102 by means of the range restriction circuit 370, the DAC 300 may provide the same advantages as the above described DAC 100. In particular, also the DAC 300 may enable a DEM based activation of the N DAC cells 140 with reduced switching activity and, hence, enable a trade-off between caused harmonic distortions and DAC cell switching activity.

As described above, the range restriction circuit 370 may allow to generate the shift codes 104 such that $0 \leq r_i < D \leq N-1$ for each of the shift codes 104. As in the example of FIG. 1, a bit-shifter circuit 120 may be used that is capable of circularly shifting the second digital codes 102 at maximum by D−1 bit positions in order to reduce the implementation complexity of the bit-shifter circuit 120.

Similarly to what is described above, the range restriction circuit 370 may in some examples be configured to generate the shift codes 104 by modifying the raw shift codes 106 such that $0 \leq r_i \leq D < N-1$ during a first time interval and that $b \leq \tilde{r}_i < D+b \leq N+b-1$ with $r_i = \tilde{r}_i$ mod N during a second time interval.

The range restriction circuit 370 may be configured to adjust the value of D based on control data similar to what is described above. For example, the control data may indicate the value of D. In other examples, the control data may indicate a signal property of a digital signal from which the first digital control code is derived or a target property of analog signal which is based on the analog output signal 105 of the DAC 300. Accordingly, the range restriction circuit 370 may be configured to adjust the value of D based on the signal property of the digital signal or the target property of the analog signal.

Figure 5:
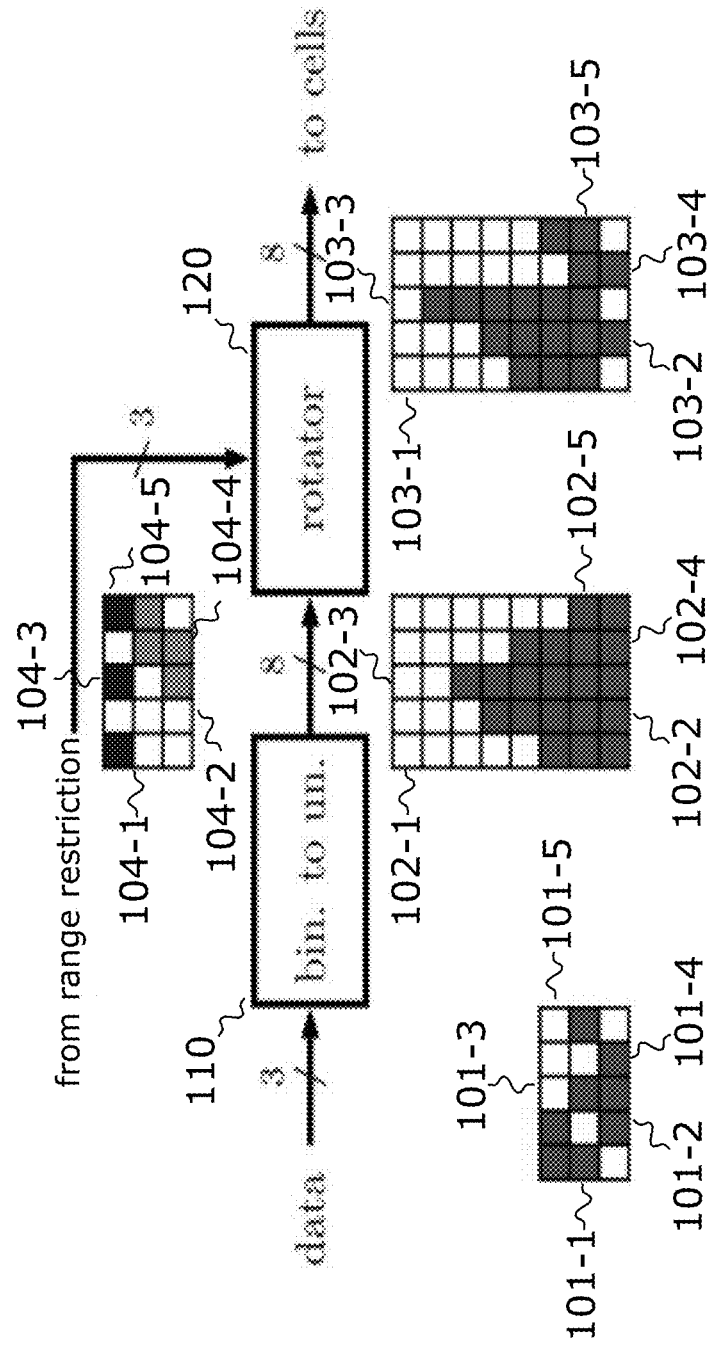
FIG. 5 illustrates a third example of digital control code conversion.
Figure 6:
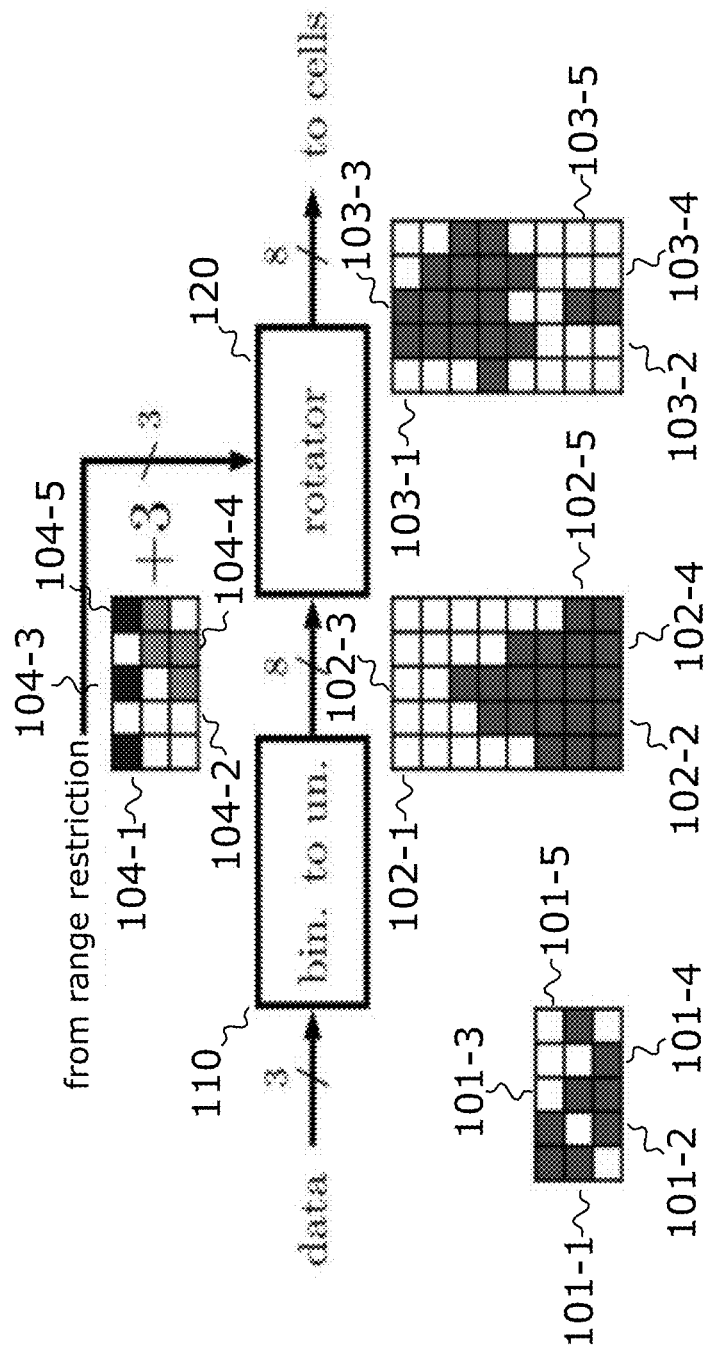
FIG. 6 illustrates a fourth example of digital control code conversion.

For example, a bit length of the raw shift codes 106 may be m and the number N of DAC cells 140 may be $N=2^m$. In order to assure that $r_i < N-1$, $r_i$ may be selected such that $r_i < 2^{m'}$ with m'<m. For example, the value of D may be selected to be $D=2^{m'}$ such that $0 \leq r_i < 2^{m'} \leq N-1$ is valid. In order to assure that $r_i < N-1$, the range restriction circuit 370 may, e.g., be configured to modify the raw shift codes 106 by masking bits of the raw shift codes at all bit positions equal to or greater than m' in order to generate the shift codes 104. Three examples of this process are illustrated in FIGS. 4 to 6.

Figure 4:
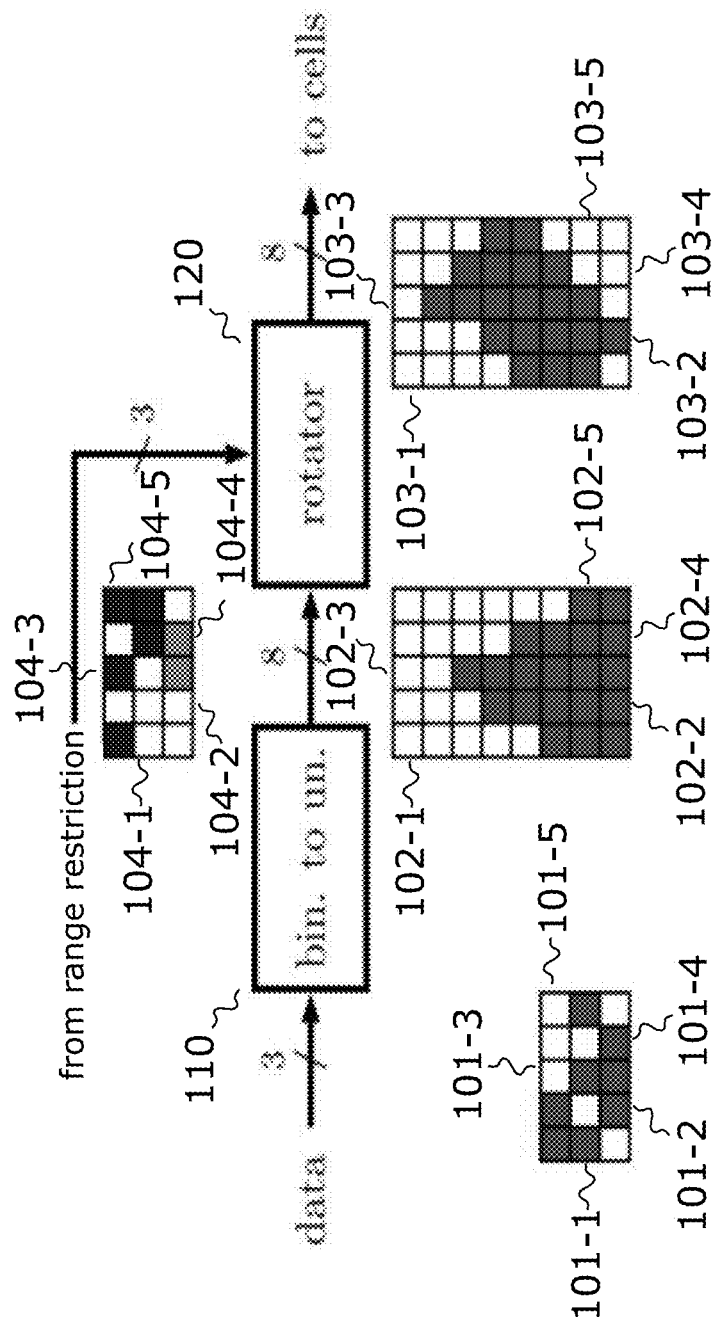
FIG. 4 illustrates a second example of digital control code conversion.

FIG. 4 illustrates a first example. In the example of FIG. 4, a sequence of five first digital control codes 101-1, . . . 101-5 is received by the code converter circuit 110. The first digital control codes 101-1, . . . 101-5 are binary codes with a bit-length of m=3 for controlling $N=2^m=8$ DAC cells. The hatched (colored) blocks in each column indicate the "1's" of the respective first digital control code, and the white blocks in each column indicate the "0's" of the respective first digital control code.

The code converter circuit 110 converts the five first digital control codes 101-1, . . . 101-5 by binary-to-unitary conversion such that five second digital control codes 102-1, . . . 102-5 are obtained. The second digital control codes 102-1, . . . 102-5 are unitary codes. Similarly to what is described above for the first digital control codes, the hatched (colored) blocks in each column indicate the "1's" of the respective second digital control code, and the white blocks in each column indicate the "0's" of the respective second digital control code.

The bit-shifter circuit 120 receives the five second digital control codes 102-1, . . . 102-5 and receives five shift codes 104-1, ... 104-5 for the second digital control codes 102-1, ... 102-5. Each of the shift codes 104-1, ... 104-5 indicates a respective circular shift by $r_i$ bit positions for the i-th second digital control code among second digital control codes 102-1, ... 102-5. Similarly to what is described above for the first digital control codes, the hatched (colored) blocks in each column indicate the "1's" of the respective shift code, and the white blocks in each column indicate the "0's" of the respective shift code.

In the example of FIG. 4, the bit-length of raw shift codes is m=3. Further, m'=2. The bit at the bit position 3 is masked in each of the shift codes 104-1, ... 104-5. In the example of FIG. 4, the bit position 3 is represented by the bottom most block in each column. The masking of the "1's" of the raw shift codes is indicated for the shift codes 104-3 and 104-4 for which the respective bottom most block is grey but not hatched. The masked "0's" of the raw shift codes for the shift codes 104-1, 104-2 and 104-5 are again illustrated in white.

Masking the bits of the raw shift codes at the bit position 3 may allow to generate the shift codes 104-1, ... 104-5 such that the respectively indicated value $r_i$ may be limited to $0 \leq r_i < D = 2^{m'} \leq N-1$.

The bit-shifter circuit 120 circularly shifts each of the second digital control codes 102-1, ... 102-5 by the number $r_i$ of bit positions indicated by the corresponding one of the shift codes 104-1, ... 104-5. For example, the bit-shifter circuit 120 circularly shifts the second digital control code 102-2 by the number $r_2$ of bit positions indicated by the shift code 104-2. The bit-shifter circuit 120 outputs the generated third digital control codes 103-1, ... 103-5. Similarly to what is described above for the first and second digital control codes, the hatched (colored) blocks in each column indicate the "1's" of the respective third digital control code, and the white blocks in each column indicate the "0's" of the respective third digital control code.

As can be seen from FIG. 4, the shift codes 104-1, ... 104-5 allow to scramble the second digital control codes 102-1, ... 102-5 and, hence, the activated DAC cells. As the value range for the circular shifts of the second digital control codes 102-1, ... 102-5 is limited, the switching activity may be reduced and, hence, a trade-off between harmonic distortions in the analog output signal of the DAC and the DAC cell switching activity may be achieved.

FIG. 5 illustrates a second example in which m'=1 instead of m'=2 like in the example of FIG. 4. Accordingly, the bits at the bit positions 2 and 3 are masked in each of the shift codes 104-1, ... 104-5. In the example of FIG. 5, the bit positions 2 and 3 are represented by the two bottom most blocks in each column. The masking of the "1's" of the raw shift codes is indicated for the shift codes 104-3, 104-4 and 104-5 for which the respective blocks are grey but not hatched. The masked "0's" of the raw shift codes for the shift codes 104-1 and 104-2 are again illustrated in white.

As can be seen by comparing the third digital control codes 103-1, ... 103-5 generated in the examples of FIG. 4 and FIG. 5, different DAC cells will be activated due to the different shift codes 104-1, ... 104-5.

FIG. 6 illustrates a third example in which an offset of b=3 is used in comparison to the example of FIG. 5. Accordingly, the shift codes 104-1, ... 104-5 are generated such that the respectively indicated value $r_i$ is limited to $b \leq \hat{r}_i = r_i < D + b = 2^{m'} + b \leq N + b - 1$.

As can be seen by comparing the third digital control codes 103-1, ... 103-5 generated in the examples of FIG. 5 and FIG. 6, the activated DAC cells are shifted by 3 DAC cells due to the offset between the shift codes 104-1, ... 104-5. Nevertheless, as the value range for the circular shifts of the second digital control codes 102-1, ... 102-5 is also limited in the example of FIG. 6, the switching activity may be reduced and, hence, a trade-off between harmonic distortions in the analog output signal of the DAC and the DAC cell switching activity may be achieved.

In the examples of FIGS. 4 to 6, the rotation of the second digital control codes 102-1, ... 102-5 is reduced. In particular, the individual Most-Significant Bits (MSBs) of the raw shift codes (e.g. output by a random or pseudorandom DEM algorithm) are masked. In the examples of FIGS. 4 to 6, $D=2^{m'}$ with m'<m, i.e. a power of two. However, it is to be noted that the present disclosure is not limited thereto. Also other values may be used for D (i.e. values which are not a power of two).

Figure 7:
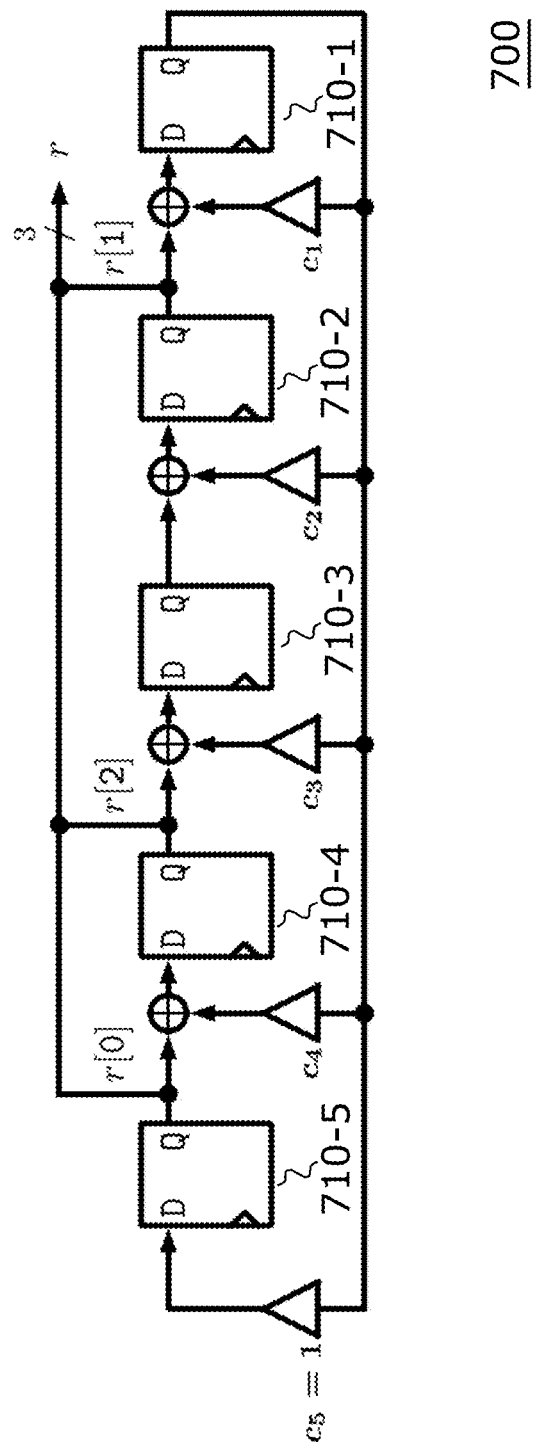
FIG. 7 illustrates an example of a linear-feedback shift register.

FIG. 7 illustrates an example of a Linear-Feedback Shift Register (LFSR) 700 which may be used by the processing circuitry 150 to generate the shift codes 104 or the processing circuitry 350 to generate the raw shift codes 106.

The LFSR 700 may be used to generate a sequence of numbers independent from the DAC's input data, i.e. independent from the first digital control codes 101. If necessary, these numbers may be conditioned in some manner for improving statistical properties and be used as the values $r_i$ or $k_i$ indicating the circular shift of the second digital control codes 102-1, ... 102-5.

In the example of FIG. 7, the LSFR 700 comprises five flip-flop circuits (latches) 710-1, ... 710-5 with a generic generator polynomial with coefficients $c_i \in \{0,1\}$. The LSFR 700 comprises three taps to combine three bits of the LSFR 700 such that values $r_i$ or $k_i$ with a big length of g=3 may be generated.

Figure 8:
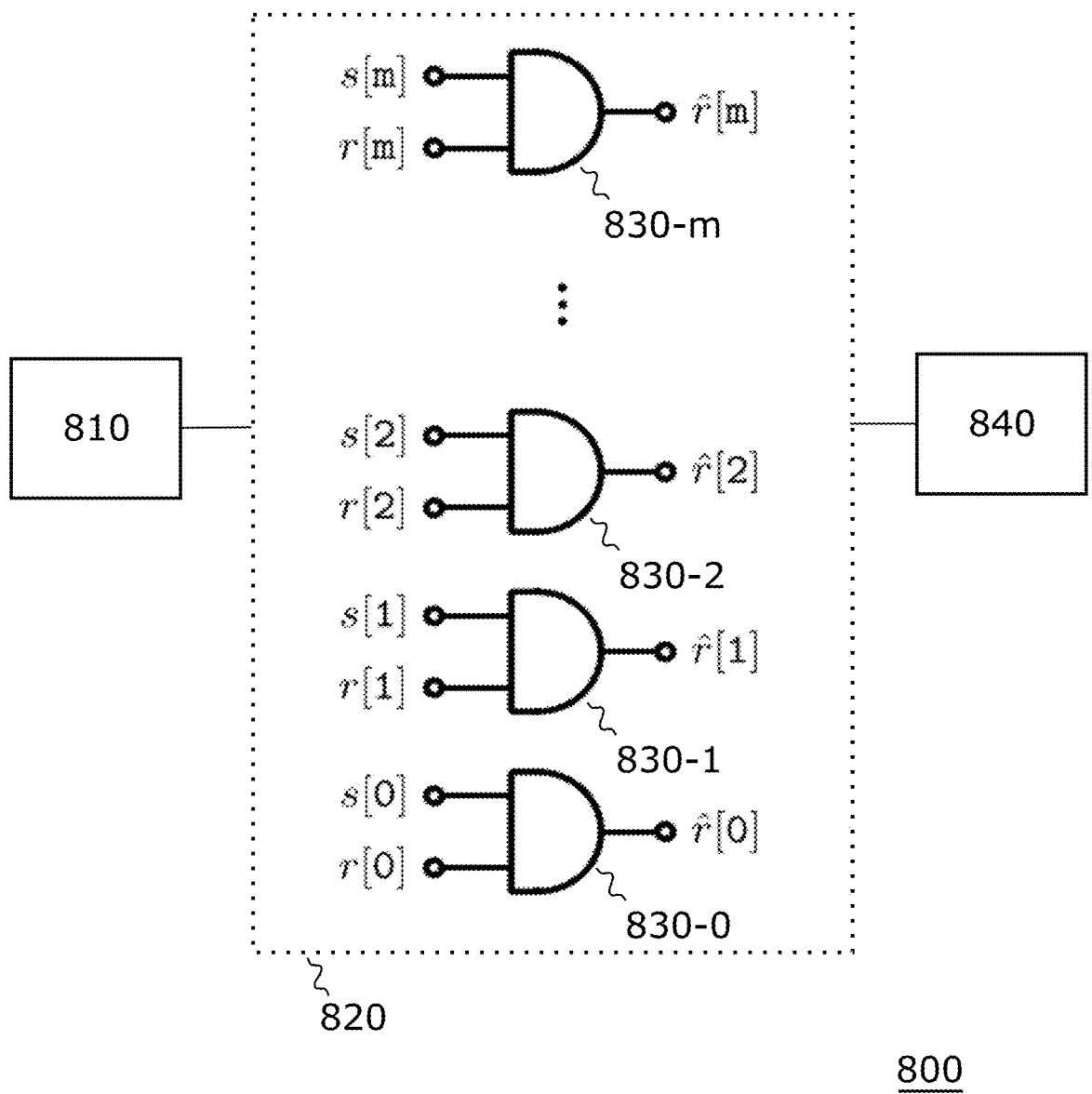
FIG. 8 illustrates an example of a range restriction circuit.

FIG. 8 further illustrates an example of a range restriction circuit 800 that may be used in the above described DAC 300.

The range restriction circuit 800 allows to modify the raw shift codes by masking bits of the raw shift codes at all bit positions equal to or greater than m' such that $r_i < 2^{m'}$ with m'<m.

The range restriction circuit 800 comprises a masking code generation circuit 810. The masking code generation circuit 810 is configured to generate a masking code s of bit length m for one of the raw shift codes by setting bits of the masking code at all bit positions smaller than m' to a first bit value (e.g. "1") and setting bits of the masking code at all bit positions equal to or greater than m' to a second bit value (e.g. "0") different from the first bit value. The masking code generation circuit 810 is configured to generate a respective masking code for each of the raw shift codes. This may be expressed as follows:

$$s[l] = \begin{cases} 1, & l < m' \\ 0, & l \geq m' \end{cases} \quad (1)$$

The range restriction circuit 800 further comprises logic circuitry 820 configured to perform, for each bit position $l_j$ with $0 \leq j \leq m$, a logic AND-combination of a bit of the one of the raw shift codes at the bit position $l_j$ and a bit of the masking code at the bit position $l_j$ in order to generate a modified bit for the bit position $l_j$. For example, if $l_j=1$, the logic circuitry 820 performs a logic AND-combination first bit of the one of the raw shift codes and the first bit of the masking code for the one of the raw shift codes.

The logic circuitry 820 may be implemented in various ways. In the example of FIG. 8, the logic circuitry 820 comprises a respective AND-gate 830-0, . . . 830-m that performs the logic AND-combination for each bit position $l_j$. It is to be noted that also other combinations of logic-gates may be used. In particular, other examples of the logic circuitry 820 may allow for upper limits of the rotation not being a power of two.

The range restriction circuit 800 additionally comprises a combiner circuit 840 configured to combine the modified bits r̂[l] output by the logic circuitry 820 in order to generate (obtain) one of the shift codes.

The, e.g., (pseudo-)random output r̂[l] may be kept uniformly distributed to avoid noise shaping and re-introduce correlation of the DAC cells' errors with the input signal.

Figure 9:
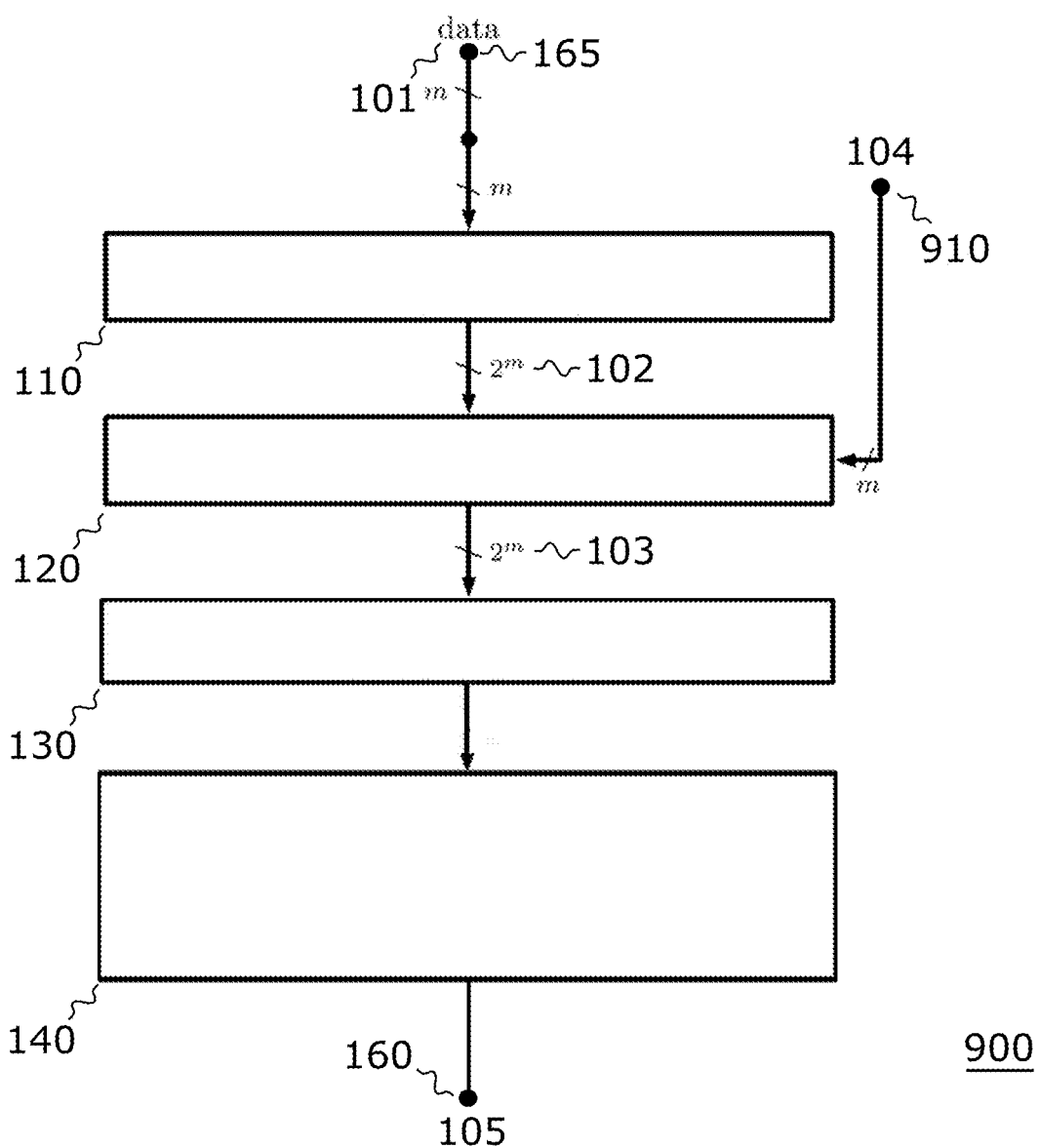
FIG. 9 illustrates a third example of a DAC.

In the above described DACs 100 and 300, the shift codes 104 are generated within the DAC. However, the present disclosure is not limited thereto. The shift codes may alternatively be generated outside the DAC. FIG. 9 illustrates a corresponding example of a DAC 900.

In comparison to the DAC 100, the DAC 900 does not comprise the processing circuitry 150 that generates the shift codes 104. Instead, the DAC 900 comprises another input node 910 coupled to processing circuitry (not illustrated) which is external to the DAC 900. The external processing circuitry is configured to execute a DEM algorithm and generates the shift codes 104 similar to what is described above. The input node 910 is configured to receive the shift codes 104 from the external processing circuitry.

Other than that, the DAC 900 is identical to the above described DAC 100.

Figure 10:
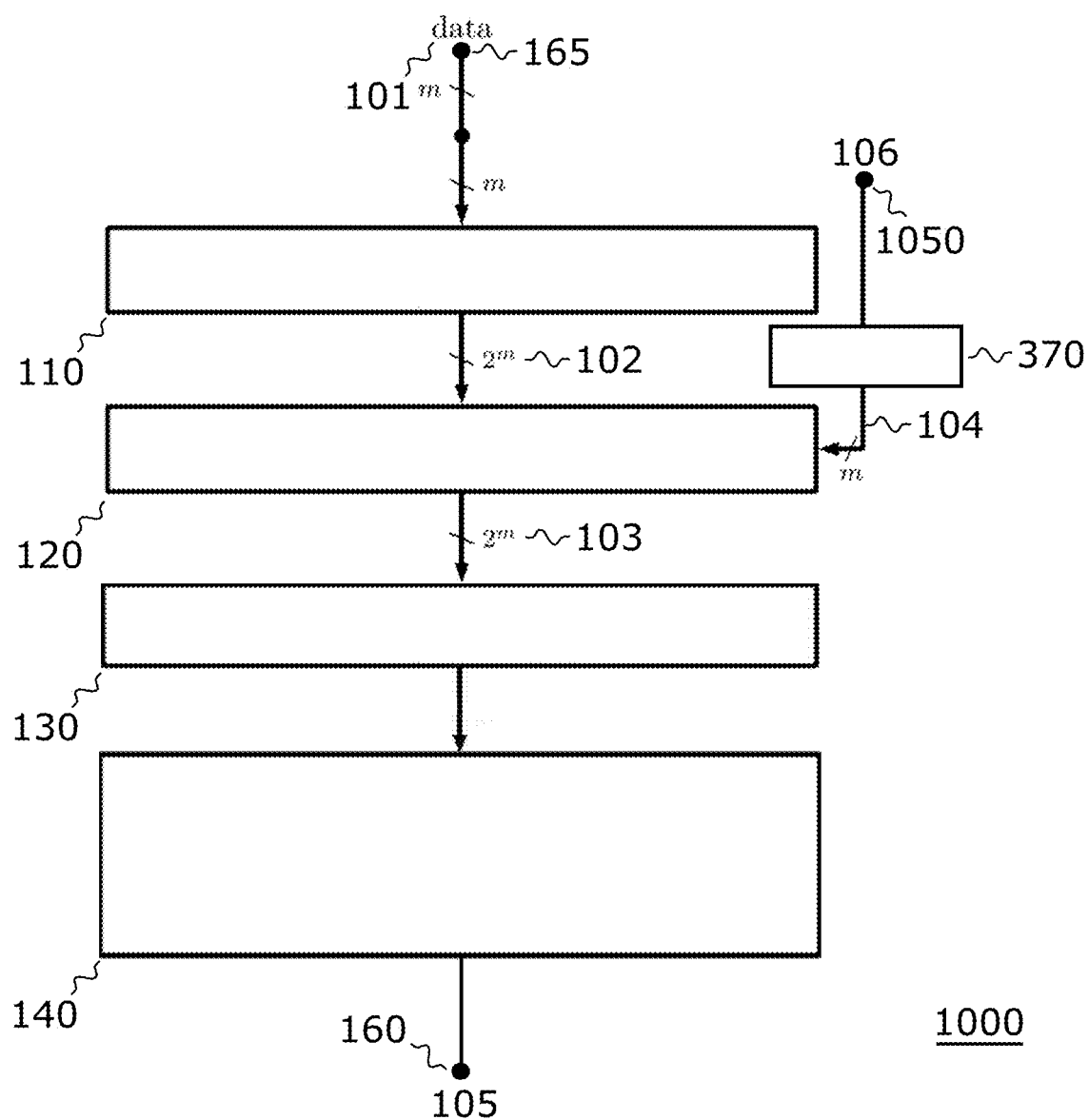
FIG. 10 illustrates a fourth example of a DAC.

Another example of a DAC 1000 is illustrated in FIG. 10. The DAC 1000 is similar to the above described DAC 300. In comparison to the DAC 300, the DAC 1000 does not comprise the processing circuitry 350 that generates the raw shift codes 106. Instead, the DAC 1000 comprises another input node 1050 coupled to processing circuitry (not illustrated) which is external to the DAC 1000. The external processing circuitry is configured to execute a DEM algorithm and generates the raw shift codes 106 similar to what is described above.

Other than that, the DAC 1000 is identical to the above described DAC 300.

The DACs 900 and 1000 may, e.g., be used for lower-speed applications.

Figure 11:
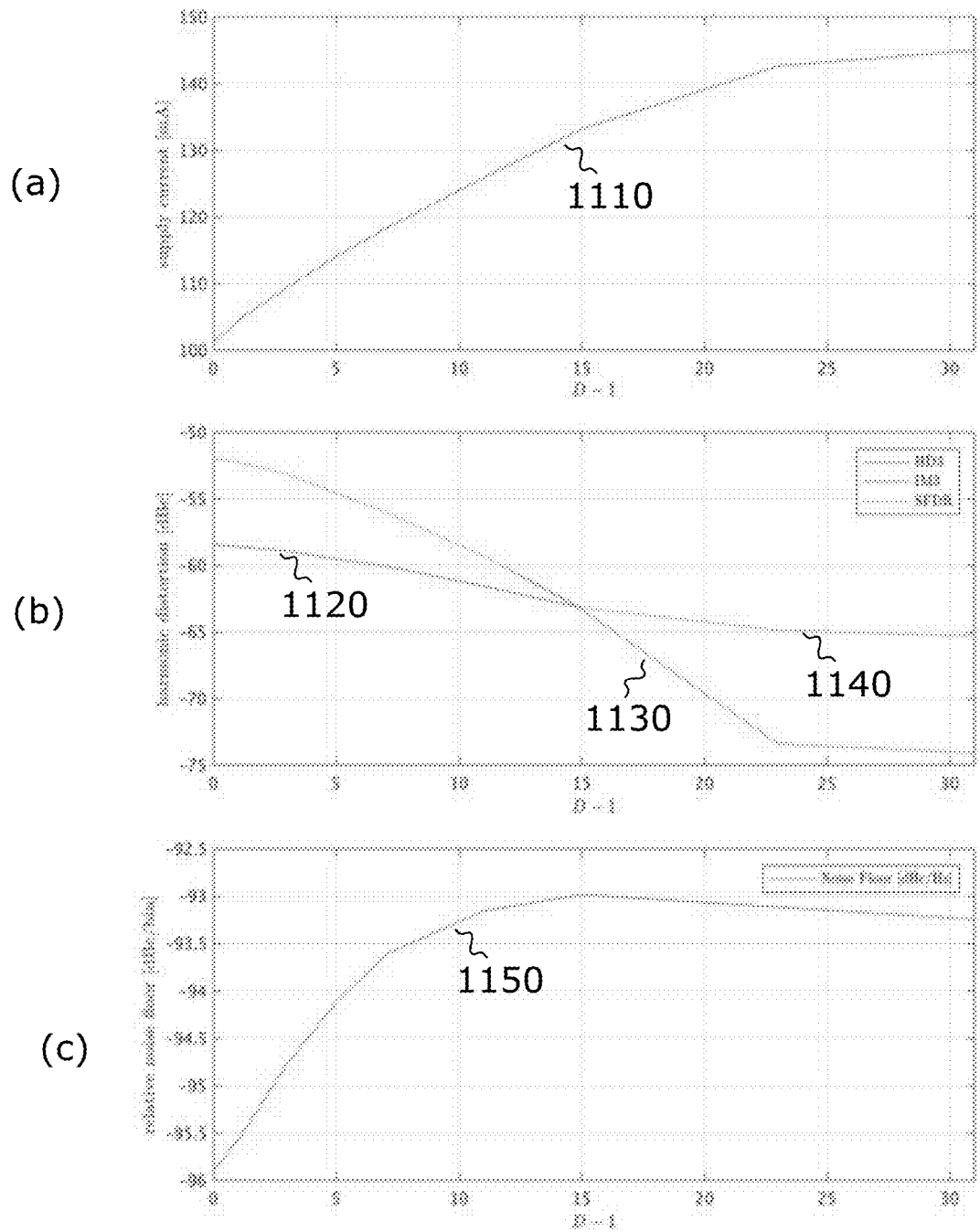
FIG. 11 illustrates various exemplary characteristics of a DAC.

FIG. 11 illustrates some exemplary characteristics of a DAC according to the present disclosure. In particular, a 5-bit wideband DAC (i.e. m=5 and N=32) for a two-tone signal at 4.87 GHZ with −6 dBFS RMS power is used in the example of FIG. 11.

Sub-figure (a) illustrates the supply current drawn 1110 by the DAC over possible values of the parameter D for limiting the code rotation.

Similarly, sub-figure (b) illustrates the power of third order harmonics 1120 in the DAC's analog output signal, the power of the third order intermodulation distortions 1130 in the DAC's analog output signal and the Spurious-Free Dynamic Range (SFDR) 1140 of the DAC over possible values of the parameter D.

Sub-figure (c) illustrates the noise floor 1150 in the DAC's analog output signal.

In particular, the abscissa denotes D−1 in each of the sub-figures (a) to (c).

As can be seen from sub-figures (b) and (c), with increasing D, the harmonic distortions decrease at the cost of an increased noise floor. Furthermore, as can be seen from sub-figure (a), the power consumption of the DAC increases due to the increased switching activity.

As a reference, the value D−1=31 denotes the characteristics of a conventional DAC. For the conventional DAC, the power consumption becomes nearly independent of the signal's power, causing a large and potentially unnecessary power overhead. The chosen value of D depends on the specification, e.g. an SFDR lower than −60 dBc may be reached with D≤16.

As can be seen from FIG. 11, the proposed DEM based technology may allow to trade-off power consumption, noise floor, and harmonic distortions and thus presents a highly effective tool to sufficiently improve the linearity and performance of a wideband DAC with a minimal power overhead.

Figure 12:
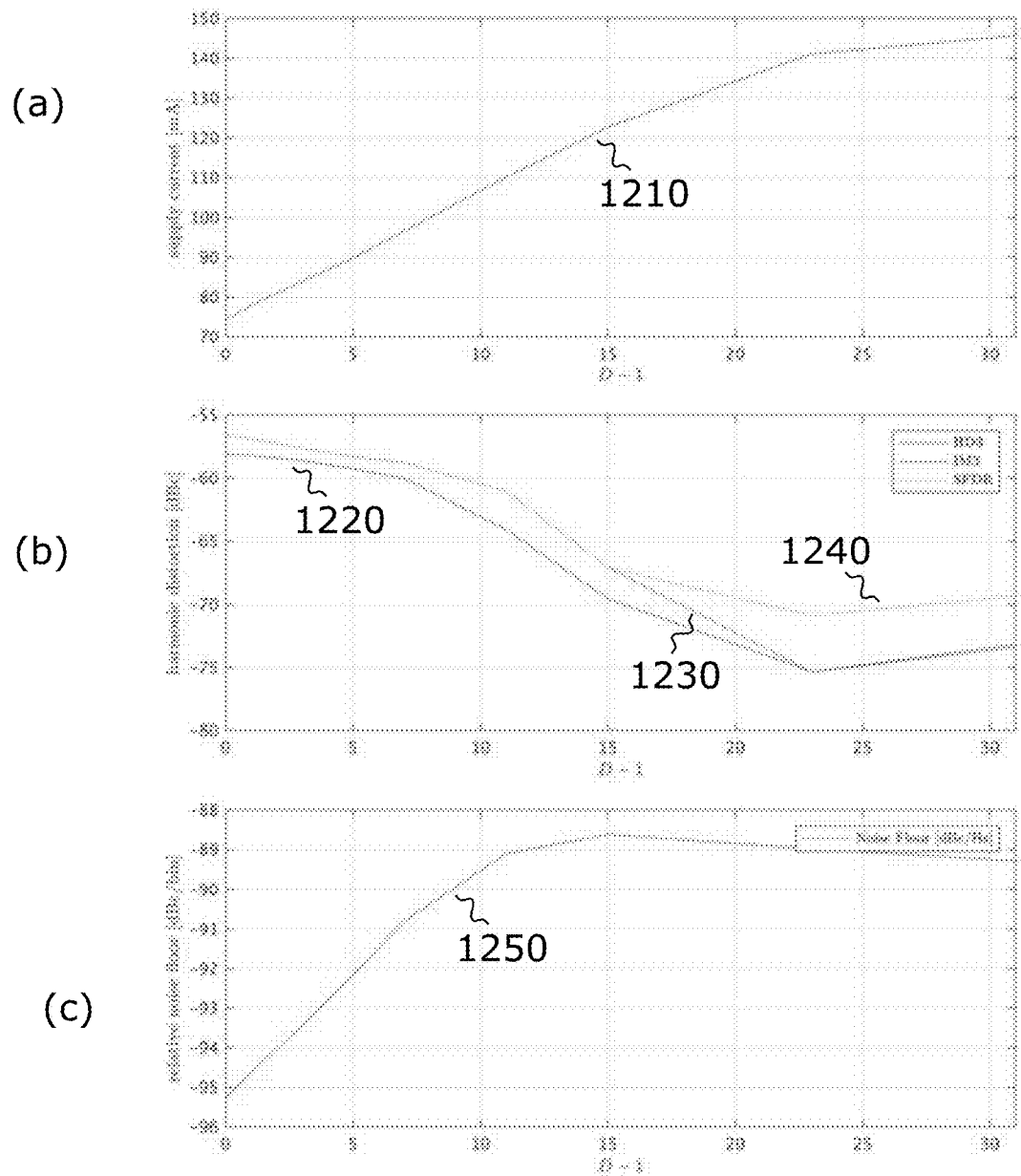
FIG. 12 illustrates various exemplary characteristics of another DAC.

FIG. 12 similarly illustrates exemplary characteristics of another DAC according to the present disclosure. In particular, a 5-bit wideband DAC (i.e. m=5 and N=32) for a two-tone signal at 4.87 GHZ with −12 dBFS RMS power is used in the example of FIG. 12.

Sub-figure (a) illustrates the supply current drawn 1210 by the DAC over possible values of the parameter D for limiting the code rotation.

Similarly, sub-figure (b) illustrates the power of third order harmonics 1220 in the DAC's analog output signal, the power of the third order intermodulation distortions 1230 in the DAC's analog output signal and the SFDR 1240 of the DAC over possible values of the parameter D.

Sub-figure (c) illustrates the noise floor 1250 in the DAC's analog output signal.

The abscissa denotes again D−1 in each of the sub-figures (a) to (c).

By comparing the corresponding sub-figures of FIGS. 11 and 12, it can be seen that the characteristics of both exemplary DACs behave substantially in the same way.

Figure 13:
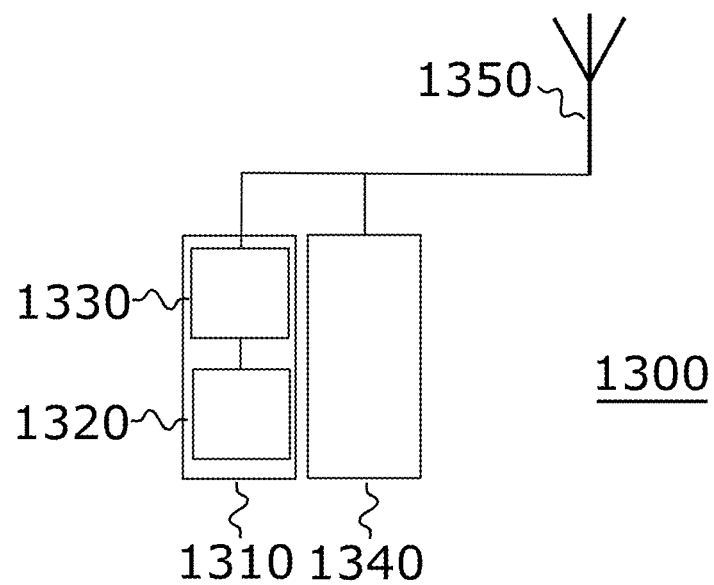
FIG. 13 illustrates an example of a base station.

An example of an implementation using digital-to-analog conversion according to one or more aspects of the architecture described above in connection with FIGS. 1 to 10 or one or more examples described above in connection with FIGS. 1 to 10 is illustrated in FIG. 13. FIG. 13 schematically illustrates an example of a radio base station 1300 (e.g. for a femtocell, a picocell, a microcell or a macrocell) comprising a DAC 1330 as proposed.

A transmitter 1310 of the base station 1300 comprises the DAC 1330. Additionally, the transmitter 1310 comprises digital circuitry 1320. The DAC 1330 is coupled to the digital circuitry 1320. The digital circuitry 1320 is configured to supply the first digital control codes to the DAC 1330. The DAC 1330 generates its analog output signal based on the first digital control codes. In other words, the DAC 1330 converts the first digital control codes to the analog output signal. The analog output signal of the DAC 1330 may, e.g., be an analog RF signal. For example, the digital circuitry 1320 may be configured to generate the first digital control codes based on data to be wirelessly transmitted.

The base station 1300 comprises at least one antenna element 1350 coupled to the transmitter 1310 for radiating an RF transmit signal to the environment. The RF transmit signal may be equal to the analog output signal of the DAC 1330 or be based on the analog output signal of the DAC 1330. For example, the transmitter 1310 may be coupled to the antenna element 1350 via one or more intermediate elements such as a filter, an up-converter (mixer) or a power amplifier.

Additionally, the base station 1300 comprises a receiver 1340 configured to receive a RF receive signal from the antenna element 1350 or another antenna element (not illustrated) of the base station 1300.

To this end, a base station with improved digital-to-analog conversion may be provided.

The base station 1300 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 14:
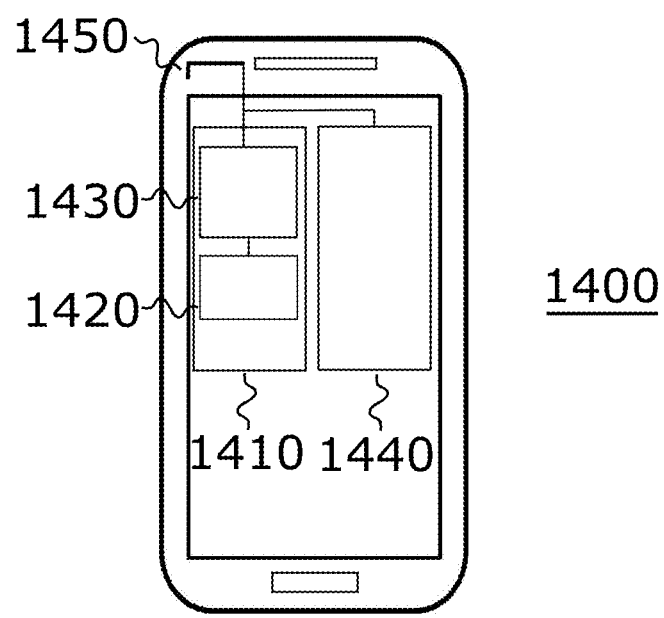
FIG. 14 illustrates an example of a mobile device.

Another example of an implementation using digital-to-analog conversion according to one or more aspects of the architecture described above in connection with FIGS. 1 to 10 or one or more examples described above in connection with FIGS. 1 to 10 is illustrated in FIG. 14. FIG. 14 schematically illustrates an example of a mobile device 1400 (e.g. mobile phone, smartphone, tablet-computer, or laptop) comprising a DAC 1430 as proposed.

A transmitter 1410 of the mobile device 1400 comprises the DAC 1430. Additionally, the transmitter 1410 comprises digital circuitry 1420. The DAC 1430 is coupled to the digital circuitry 1420. The digital circuitry 1420 is configured to supply the first digital control codes to the DAC 1430. The DAC 1430 generates its analog output signal based on the first digital control codes. In other words, the DAC 1430 converts the first digital control codes to the analog output signal. The analog output signal of the DAC 1430 may, e.g., be an analog RF signal. For example, the digital circuitry 1420 may be configured to generate the first digital control codes based on data to be wirelessly transmitted.

The mobile device 1400 comprises at least one antenna element 1450 coupled to the transmitter 1410 for radiating an RF transmit signal to the environment. The RF transmit signal may be equal to the analog output signal of the DAC 1430 or be based on the analog output signal of the DAC 1430. For example, the transmitter 1410 may be coupled to the antenna element 1450 via one or more intermediate elements such as a filter, an up-converter (mixer) or a power amplifier.

Additionally, the mobile device 1400 comprises a receiver 1440 configured to receive a RF receive signal from the antenna element 1450 or another antenna element (not illustrated) of the mobile device 1400.

To this end, a mobile device with improved digital-to-analog conversion may be provided.

The mobile device 1400 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using digital-to-analog conversion according to the proposed architecture or one or more of the examples described above may be configured to operate according to one of the 3rd Generation Partnership Project (3GPP)-standardized mobile communication networks or systems. The mobile or wireless communication system may correspond to, for example, a $5^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 15:
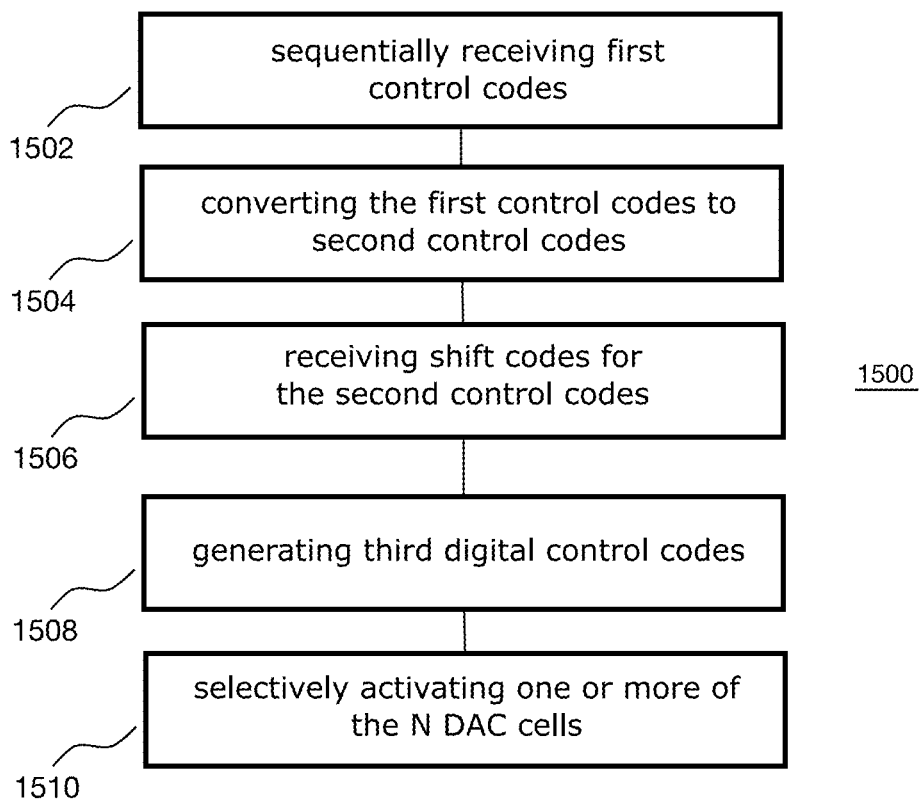
FIG. 15 illustrates flowchart of an example of a method for a DAC.

For further illustrating the digital-to-analog conversion described above, FIG. 15 illustrates a flowchart of method 1500 for a DAC. The method 1500 comprises sequentially receiving 1502 first digital control codes for controlling N DAC cells. N is an integer greater than one. Further, the method 1500 comprises converting 1504 the first digital control codes to second digital control codes. The method 1500 additionally comprises receiving 1506 shift codes for the second digital control codes. The shift codes are obtained using DEM and indicate a respective circular shift by $r_i$ bit positions for the i-th second digital control code. $r_i$ is an integer smaller than N−1. The method 1500 further comprises generating 1508 third digital control codes by circularly shifting the second digital codes based on the shift codes. In addition, the method 1500 comprises selectively activating 1510 one or more of the N DAC cells based on the third digital control codes.

The method 1500 may enable a DEM based activation of the N DAC cells with reduced switching activity and, hence, enable a trade-off between caused harmonic distortions and DAC cell switching activity.

More details and aspects of the method 1500 are explained in connection with the proposed technique or one or more examples described above (e.g. FIGS. 1 to 10). The method 1500 may comprise one or more additional optional features corresponding to one or more aspects of the proposed technique or one or more examples described above.

The examples described herein may be summarized as follows:

Example 1 is a digital-to-analog converter, comprising: a code converter circuit configured to: sequentially receive first digital control codes for controlling N digital-to-analog converter cells, wherein N is an integer greater than one; and convert the first digital control codes to second digital control codes; a bit-shifter circuit configured to: receive shift codes for the second digital control codes, wherein the shift codes are obtained using dynamic element matching and indicate a respective circular shift by $r_i$ bit positions for the i-th second digital control code, and wherein $r_i$ is an integer smaller than N−1; generate third digital control codes by circularly shifting the second digital codes based on the shift codes; a cell activation circuit configured to selectively activate one or more of the N digital-to-analog converter cells based on the third digital control codes.

Example 2 is the digital-to-analog converter of example 1, further comprising processing circuitry configured to generate the shift codes by dynamic element matching.

Example 3 is the digital-to-analog converter of example 2, wherein the processing circuitry is configured to generate the shift codes based on the first digital control codes by dynamic element matching.

Example 4 is the digital-to-analog converter of example 2 or example 3, wherein $0 \leq r_i < D \leq N-1$ with D being an integer.

Example 5 is the digital-to-analog converter of example 4, wherein the bit-shifter circuit is capable of circularly shifting the second digital codes at maximum by D−1 bit positions.

Example 6 is the digital-to-analog converter of any of examples 2 to 4, wherein the processing circuitry configured to generate the shift codes such that $0 \leq r_i < D \leq N-1$ during a first time interval and that $b \leq \hat{r}_i < D+b \leq N-1+b$ with $r_i = \hat{r}_i$ mod N during a second time interval, and wherein D and b are integers.

Example 7 is the digital-to-analog converter of any of examples 4 to 6, wherein the processing circuitry is configured to adjust the value of D based on control data.

Example 8 is the digital-to-analog converter of example 7, wherein the control data indicate the value of D.

Example 9 is the digital-to-analog converter of example 7, wherein the control data indicate a signal property of a digital signal from which the first digital control code is derived or a target property of analog signal which is based on an analog output signal of the digital-to-analog converter, and wherein the processing circuitry is configured to adjust the value of D based on the signal property of the digital signal or the target property of the analog signal.

Example 10 is the digital-to-analog converter of any of examples 2 to 9, wherein the processing circuitry is configured to generate the shift code based on a random or pseudorandom binary sequence.

Example 11 is the digital-to-analog converter of example 1, further comprising: processing circuitry configured to generate raw shift codes by dynamic element matching, wherein the raw shift codes indicate a respective circular shift by $k_i$ bit positions for the i-th second digital control code, and a range restriction circuit configured to modify all of the raw shift codes indicating $k_i \geq N-1$ in order to obtain the shift codes.

Example 12 is the digital-to-analog converter of example 11, wherein the processing circuitry is configured to generate the raw shift codes based on the first digital control codes by dynamic element matching.

Example 13 is the digital-to-analog converter of example 11 or example 12, wherein the processing circuitry is configured to generate the raw shift code based on a random or pseudorandom binary sequence.

Example 14 is the digital-to-analog converter of any of examples 11 to 13, wherein $0 \leq r_i < D \leq N-1$ with D being an integer.

Example 15 is the digital-to-analog converter of example 14, wherein the bit-shifter circuit is capable of circularly shifting the second digital codes at maximum by D−1 bit positions.

Example 16 is the digital-to-analog converter of any of examples 11 to 15, wherein the range restriction circuit is configured to modify the raw shift codes such that $0 \leq r_i < D \leq N-1$ during a first time interval and that $b \leq \hat{r}_i < D+b \leq N-1+b$ with $r_i = \hat{r}_i$ mod N during a second time interval, and wherein D and b are integers.

Example 17 is the digital-to-analog converter of any of examples 14 to 16, wherein the range restriction circuit is configured to adjust the value of D based on control data.

Example 18 is the digital-to-analog converter of example 17, wherein the control data indicate the value of D.

Example 19 is the digital-to-analog converter of example 17, wherein the control data indicate a signal property of a digital signal from which the first digital control code is derived or a target property of analog signal which is based on an analog output signal of the digital-to-analog converter, and wherein the range restriction circuit is configured to adjust the value of D based on the signal property of the digital signal or the target property of the analog signal.

Example 20 is the digital-to-analog converter of any of examples 11 to 19, wherein a bit length of the raw shift codes is m, wherein $r_i < 2^{m'}$ with m'<m, and wherein the range restriction circuit is configured to modify the raw shift codes by masking bits of the raw shift codes at all bit positions equal to or greater than m'.

Example 21 is the digital-to-analog converter of example 20, wherein the range restriction circuit comprises: a masking code generation circuit configured to generate a masking code of bit length m for one of the raw shift codes by setting bits of the masking code at all bit positions smaller than m' to a first bit value and setting bits of the masking code at all bit positions equal to or greater than m' to a second bit value different from the first bit value; logic circuitry configured to perform, for each bit position $l_j$ with $0 < j \le m$, a logic AND-combination of a bit of the one of the raw shift codes at the bit position $l_j$ and a bit of the masking code at the bit position $l_j$ in order to generate a modified bit for the bit position $l_j$; and a combiner circuit configured to combine the modified bits in order to generate one of the shift codes.

Example 22 is the digital-to-analog converter of example 1, further comprising: an input node configured to receive the shift codes from processing circuitry configured to execute a dynamic element matching algorithm, the processing circuitry being external to the digital-to-analog converter.

Example 23 is the digital-to-analog converter of example 1, further comprising: an input node configured to receive raw shift codes from processing circuitry configured to execute a dynamic element matching algorithm, the processing circuitry being external to the digital-to-analog converter, wherein the raw shift codes indicate a respective circular shift by $k_i$ bit positions for the i-th second digital control code; and a range restriction circuit configured to modify one or more bits of the raw shift codes in order to obtain the shift codes if $k_i \ge N-1$.

Example 24 is the digital-to-analog converter of example 23, wherein a bit length of the raw shift code is m, wherein $r_i < 2^{m'}$ with m'<m, and wherein the range restriction circuit is configured to modify one or more bits of the raw shift codes by masking bits of the raw shift codes at all bit positions equal to or greater than m'.

Example 25 is the digital-to-analog converter of any of examples 1 to 24, wherein the first digital control codes are binary codes, and wherein the second digital control codes are unitary codes.

Example 26 is the digital-to-analog converter of any of examples 1 to 25, wherein $N \le 2^m$ with m denoting a bit length of the first digital control codes.

Example 27 is the digital-to-analog converter of any of examples 1 to 26, wherein the N digital-to-analog converter cells are unitary weighted.

Example 28 is the digital-to-analog converter of any of examples 1 to 27, wherein each activated digital-to-analog converter cell is configured to output a respective cell output signal, and wherein the digital-to-analog converter further comprises an output node configured to output an analog output signal based on the cell output signals.

Example 29 is a transmitter, comprising: a digital-to-analog converter according to any of examples 1 to 28; and digital circuitry configured to supply the first digital control codes to the input.

Example 30 is the transmitter of example 29, wherein the digital circuitry is configured to generate the first digital control codes based on data to be wirelessly transmitted.

Example 31 is a base station, comprising: a transmitter according to example 29 or example 30; and at least one antenna element coupled to the transmitter.

Example 32 is the base station of example 31, further comprising a receiver configured to receive a radio frequency receive signal from the antenna element.

Example 33 is a mobile device, comprising: a transmitter according to example 29 or example 30; and at least one antenna element coupled to the transmitter.

Example 34 is the mobile device of example 33, further comprising a receiver configured to receive a radio frequency receive signal from the antenna element.

Example 35 is a method for a digital-to-analog converter, comprising: sequentially receiving first digital control codes for controlling N digital-to-analog converter cells, wherein N is an integer greater than one; converting the first digital control codes to second digital control codes; receiving shift codes for the second digital control codes, wherein the shift codes are obtained using dynamic element matching and indicate a respective circular shift by $r_i$ bit positions for the i-th second digital control code, and wherein $r_i$ is an integer smaller than N−1; generating third digital control codes by circularly shifting the second digital codes based on the shift codes; and selectively activating one or more of the N digital-to-analog converter cells based on the third digital control codes.

Example 36 is the method of example 35, wherein each activated digital-to-analog converter cell outputs a respective cell output signal, and wherein the method further comprises outputting an analog output signal based on the cell output signals.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A digital-to-analog converter, comprising:
a code converter circuit configured to:
sequentially receive first digital control codes for controlling N digital-to-analog converter cells, wherein N is an integer greater than one; and
convert the first digital control codes to second digital control codes;
a bit-shifter circuit configured to:
receive shift codes for the second digital control codes, wherein the shift codes are obtained using dynamic element matching and indicate a respective circular shift by $r_i$ bit positions for the i-th second digital control code, and wherein $r_i$ is an integer smaller than $N-1$;
generate third digital control codes by circularly shifting the second digital codes based on the shift codes;
a cell activation circuit configured to selectively activate one or more of the N digital-to-analog converter cells based on the third digital control codes.

2. The digital-to-analog converter of claim 1, further comprising processing circuitry configured to generate the shift codes by dynamic element matching.

3. The digital-to-analog converter of claim 2, wherein the processing circuitry is configured to generate the shift codes based on the first digital control codes by dynamic element matching.

4. The digital-to-analog converter of claim 2, wherein $0 \leq r_i < D \leq N-1$ with D being an integer.

5. The digital-to-analog converter of claim 4, wherein the bit-shifter circuit is capable of circularly shifting the second digital codes at maximum by $D-1$ bit positions.

6. The digital-to-analog converter of claim 2, wherein the processing circuitry configured to generate the shift codes such that $0 \leq r_i < D \leq N-1$ during a first time interval and that $b \leq \tilde{r}_i < D+b \leq N-1+b$ with $r_i = \tilde{r}_i$ mod N during a second time interval, and wherein D and b are integers.

7. The digital-to-analog converter of claim 4, wherein the processing circuitry is configured to adjust the value of D based on control data.

8. The digital-to-analog converter of claim 7, wherein the control data indicate the value of D.

9. The digital-to-analog converter of claim 7, wherein the control data indicate a signal property of a digital signal from which the first digital control code is derived or a target property of analog signal which is based on an analog output signal of the digital-to-analog converter, and wherein the processing circuitry is configured to adjust the value of D based on the signal property of the digital signal or the target property of the analog signal.

10. The digital-to-analog converter of claim 2, wherein the processing circuitry is configured to generate the shift code based on a random or pseudorandom binary sequence.

11. The digital-to-analog converter of claim 1, further comprising:
processing circuitry configured to generate raw shift codes by dynamic element matching, wherein the raw shift codes indicate a respective circular shift by $k_i$ bit positions for the i-th second digital control code, and
a range restriction circuit configured to modify all of the raw shift codes indicating $k_i \geq N-1$ in order to obtain the shift codes.

12. The digital-to-analog converter of claim 11, wherein the processing circuitry is configured to generate the raw shift codes based on the first digital control codes by dynamic element matching.

13. The digital-to-analog converter of claim 11, wherein the processing circuitry is configured to generate the raw shift code based on a random or pseudorandom binary sequence.

14. The digital-to-analog converter of claim 11, wherein $0 \leq r_i < D \leq N-1$ with D being an integer.

15. The digital-to-analog converter of claim 14, wherein the bit-shifter circuit is capable of circularly shifting the second digital codes at maximum by $D-1$ bit positions.

16. The digital-to-analog converter of claim 11, wherein the range restriction circuit is configured to modify the raw shift codes such that $0 \leq r_i < D \leq N-1$ during a first time interval and that $b \leq \tilde{r}_i < D+b \leq N-1+b$ with $r_i = \tilde{r}_i$ mod N during a second time interval, and wherein D and b are integers.

17. The digital-to-analog converter of claim 14, wherein the range restriction circuit is configured to adjust the value of D based on control data.

18. The digital-to-analog converter of claim 17, wherein the control data indicate the value of D.

19. The digital-to-analog converter of claim 17, wherein the control data indicate a signal property of a digital signal from which the first digital control code is derived or a target property of analog signal which is based on an analog output signal of the digital-to-analog converter, and wherein the range restriction circuit is configured to adjust the value of D based on the signal property of the digital signal or the target property of the analog signal.

20. The digital-to-analog converter of claim 11, wherein a bit length of the raw shift codes is m, wherein $r_i < 2^{m'}$ with $m' < m$, and wherein the range restriction circuit is configured to modify the raw shift codes by masking bits of the raw shift codes at all bit positions equal to or greater than m'.

21. The digital-to-analog converter of claim 20, wherein the range restriction circuit comprises:
a masking code generation circuit configured to generate a masking code of bit length m for one of the raw shift codes by setting bits of the masking code at all bit positions smaller than m' to a first bit value and setting bits of the masking code at all bit positions equal to or greater than m' to a second bit value different from the first bit value;

logic circuitry configured to perform, for each bit position $l_j$ with $0<j\leq m$, a logic AND-combination of a bit of the one of the raw shift codes at the bit position $l_j$ and a bit of the masking code at the bit position $l_j$ in order to generate a modified bit for the bit position $l_j$; and a combiner circuit configured to combine the modified bits in order to generate one of the shift codes.

22. A transmitter, comprising:

a digital-to-analog converter according to claim 1; and digital circuitry configured to supply the first digital control codes to the input.

23. The transmitter of claim 22, wherein the digital circuitry is configured to generate the first digital control codes based on data to be wirelessly transmitted.

24. A base station, comprising:

a transmitter according to claim 22; and at least one antenna element coupled to the transmitter.

25. A method for a digital-to-analog converter, comprising:

sequentially receiving first digital control codes for controlling N digital-to-analog converter cells, wherein N is an integer greater than one;

converting the first digital control codes to second digital control codes;

receiving shift codes for the second digital control codes, wherein the shift codes are obtained using dynamic element matching and indicate a respective circular shift by $r_i$ bit positions for the i-th second digital control code, and wherein $r_i$ is an integer smaller than N−1;

generating third digital control codes by circularly shifting the second digital codes based on the shift codes; and selectively activating one or more of the N digital-to-analog converter cells based on the third digital control codes.

* * * * *